United States Patent [19]

Nakayama

[11] Patent Number: 5,463,636
[45] Date of Patent: Oct. 31, 1995

[54] SEMICONDUCTOR MEMORY DEVICE WITH BUILT-IN CONFIRMATION UNIT FOR ACCELERATING TEST

[75] Inventor: Hiroshi Nakayama, Tokyo, Japan

[73] Assignee: NEC Corporation, Tokyo, Japan

[21] Appl. No.: 67,980

[22] Filed: May 27, 1993

[30] Foreign Application Priority Data

May 27, 1992 [JP] Japan .................................... 4-134584

[51] Int. Cl.[6] ............................. G11C 29/00; G11C 8/00
[52] U.S. Cl. ....................................... 395/183.01; 365/200
[58] Field of Search ................................. 371/21.1, 21.4, 371/15.1, 21.3; 395/575; 365/230.1

[56] References Cited

U.S. PATENT DOCUMENTS

| | | | |
|---|---|---|---|
| 4,970,727 | 11/1990 | Miyawaki et al. | 371/21.3 |
| 5,051,995 | 9/1991 | Tobita | 371/21.1 |
| 5,077,738 | 12/1991 | Larsen et al. | 371/15.1 |
| 5,119,337 | 6/1992 | Shimizu et al. | 365/201 |
| 5,142,495 | 8/1992 | Canepa | 365/189.09 |

Primary Examiner—Robert W. Beausoliel, Jr.
Assistant Examiner—Norman M. Wright
Attorney, Agent, or Firm—Sughrue, Mion, Zinn, Macpeak & Seas

[57] ABSTRACT

Memory cells incorporated in a semiconductor memory device are subjected to an accelerating test before delivery to a purchaser for screening out defective products, and a word line driver unit selectively drives word lines to a test voltage level higher than a standard power voltage level to word lines for strongly biasing the memory cells, wherein a confirmation unit has a first monitoring circuit for producing a warning signal indicative of the standard power voltage level supplied to the word line driver unit in the accelerating test, a second monitoring circuit for producing a detecting signal indicative of the test voltage level, and a non-volatile memory circuit enabled with the detecting signal for storing the warning signal in a readable manner so that an analyst can confirms the accelerating test duly carried out.

9 Claims, 3 Drawing Sheets

SEMICONDUCTOR MEMORY DEVICE WITH BUILT-IN CONFIRMATION UNIT FOR ACCELERATING TEST

FIELD OF THE INVENTION

This invention relates to a semiconductor memory device and, more particularly, to a semiconductor memory device equipped with a confirmation unit for an acceleration test with boosted power voltage.

DESCRIPTION OF THE RELATED ART

A typical example of the semiconductor memory device is illustrated in FIG. 1, and the prior art semiconductor memory device largely comprises a memory cell array 1, an addressing system, a data transferring system, a controlling system and a diagnostic system. However, FIG. 1 illustrates only parts of these system concerning the accelerating test operation on the memory cell array I for the sake of simplicity.

The memory cell array 1 comprises memory cells M11, M1n, Mm1 and Mmn arranged in rows and columns, and word lines WL1 to WLm and bit lines BL1 to BLn are associated with the rows and the columns. Row addresses are respectively assigned to the word lines WL1 to WLm, and column addresses are assigned to the bit lines BL1 to BLn, respectively. Therefore, every memory cell is addressable with the row and column addresses.

A row address decoder unit 2 is coupled through a row address buffer circuit (not shown) with an address port ADD, and decodes row address bits indicative of one of the row addresses into a row address decoded signal. The row address decoder unit 2 is coupled with a word line driver unit 3, and the word line driver unit 3 is constituted by a plurality of word line driver circuits 31 to 3m. Each of the word line driver circuit 31 or 3m is fabricated from an inverter 3n and a series combination of a p-channel enhancement type switching transistor 3p and an n-channel enhancement type switching transistor 3q coupled between a positive voltage line 3r and a ground voltage line GND. The n-channel enhancement type switching transistor 3q is directly gated by the row address decoder unit 2 with the row address decoded signal, and the p-channel enhancement type switching transistor 3p is gated by the inverter 3n with the complementary signal of the row address decoded signal. The word line driver circuits 31 to 3m are respectively associated with the word lines WL1 to WLm, and each word line WL1 or WLm is coupled with the common drain node of the series combination incorporated in the associated word line driver circuit.

The positive voltage line 3r is driven by a power distributing circuit 4 responsive to a row address strobe signal RAS, and the power distributing circuit 4 comprises a delay element 4a and an inverter 4b. When the row address strobe signal RAS of active low voltage level is supplied to the delay element 4a, the delay element 4a retards the row address strobe signal RAS, and the inverter 4b is responsive to the delayed row address strobe signal for supplying a power voltage Vcc to the positive voltage line 3r. While the positive voltage level Vcc is applied to the positive voltage line 3r, one of the word line driver circuits 31 to 3m is responsive to the row address decoded signal, and the associated word line is driven to the power voltage level Vcc. Then, the associated row of memory cells are respectively conducted with the associated bit lines BL1 to BLn, and one of the bit lines BL1 to BLn is coupled with an output circuit 5. A data bit is transferred from the selected bit line to the output circuit 5, and the output circuit 5 produces an output data signal indicative of the selected data bit. The output data signal is supplied from a data port TMO to a destination.

After the prior art semiconductor memory device is built in an electronic system, a positive power voltage of 5 volts is supplied to the semiconductor memory device, and the power distributing circuit 4 supplies the power voltage level of 5 volts to the word line driver unit 3. Therefore, the word lines WL1 to WLm are selectively driven to 5 volts.

However, the semiconductor memory device is subjected to a diagnosis before delivery to a purchaser, and the memory cells M11 to Mmn are examined to see whether to be excellent or defective under strongly biased conditions, because potential defect is accelerated under the strongly biased conditions. For this reason, a test voltage or a boosted power voltage over 7 volts is supplied from a diagnostic system to the power distributing unit 4 of the prior art semiconductor memory device, and the word lines WL1 to WLm are sequentially driven to the boosted power voltage level of 7 volts.

However, a problem is encountered in the prior art semiconductor memory device in reliability of the memory cell array 1. The reason for the low reliability is that the power distributing circuit 4 fails to supply the test voltage level in the accelerating test operation, and the associated memory cells are not examined under the strongly biased conditions.

SUMMARY OF THE INVENTION

It is therefore an important object of the present invention to provide a semiconductor memory device which is improved in reliability of the memory cells.

To accomplish the object, the present invention proposes to confirm application of a test voltage to word lines before finishing a test operation under strongly biased conditions.

In accordance with the present invention, there is provided a semiconductor memory device fabricated on a semiconductor chip and selectively entering a standard mode and a diagnostic mode of operation, comprising: a) a memory cell array having a plurality of addressable memory cells for storing data information; b) a data transferring system selectively coupled with the plurality of addressable memory cells, and operative to relaying data information between the memory cell array and a data port in the standard mode of operation; c) a timing generating system coupled with a power distributing means for a predetermined voltage level and a test voltage level, and having a power distributing circuit responsive to an external control signal for selectively supplying the predetermined voltage level in the standard mode and the test voltage level in an accelerating test of the diagnostic mode to an interconnection at a predetermined timing; d) an addressing system having a plurality of word lines selectively coupled with the plurality of addressable memory cells and a word line driving unit coupled with the interconnection for selectively driving the plurality of word lines to the predetermined voltage level in the standard mode and the test voltage level larger in magnitude than the predetermined voltage level in the accelerating test operation, the plurality of memory cells selectively driven by the plurality of word lines being conducted with the data transferring system; and d) a diagnostic system having a first monitoring unit operative to monitor the interconnection to see whether or not the test voltage level is supplied to the addressing system in the accelerating test for producing a warning signal indicative of the accelerating test without the test voltage level, a second monitoring unit operative to monitor the power distributing means to see whether or not the test voltage level is supplied to the timing generating system in the accelerating test for producing a detecting signal indicative of the test voltage level, and a non-volatile memory means enabled with the detecting signal and operative to store the warning signal in a readable manner from the outside of the semiconductor memory device.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENT

Figure 1:
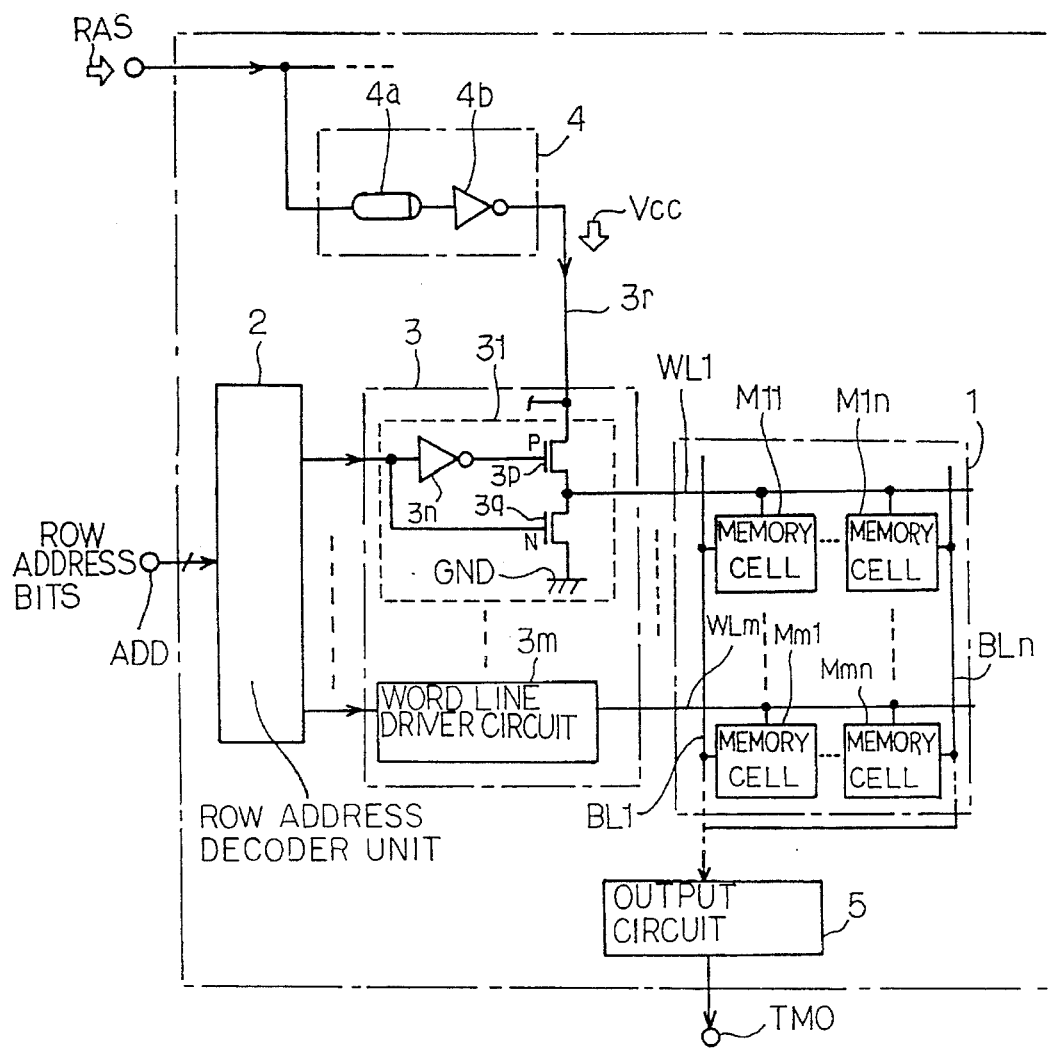
FIG. 1 is a circuit diagram showing the arrangement of the prior art semiconductor memory device.
Figure 2:
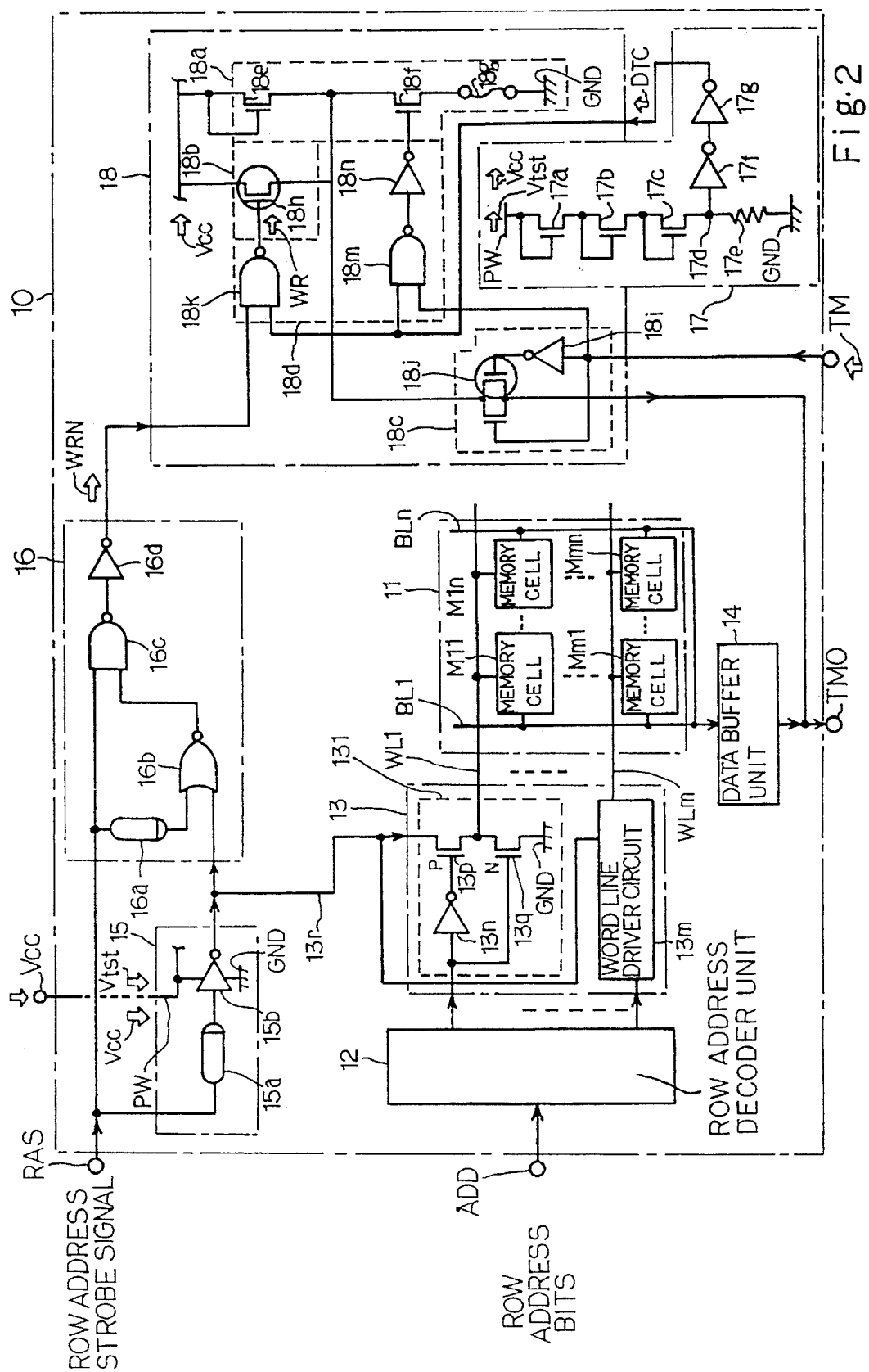
FIG. 2 is a circuit diagram showing the arrangement of a semiconductor memory device according to the present invention.

Referring to FIG. 2 of the drawings, a semiconductor memory device embodying the present invention is fabricated on a single semiconductor chip 10, and largely comprises a memory cell array 11, an addressing system, a data transferring system, a controlling system and a diagnostic system. FIG. 2 illustrates essential parts necessary for understanding the present invention. In the following description, logic "1" level and logic "0" level are assumed to be corresponding to high voltage level and low voltage level, respectively.

The memory cell array 11 comprises memory cells M11, M1n, Mm1 and Mmn arranged in rows and columns, and word lines WL1 to WLm and bit lines BL1 to BLn are associated with the rows and the columns of memory cells, respectively. Row addresses are respectively assigned to the word lines WL1 to WLm, and column addresses are assigned to the bit lines BL1 to BLn, respectively. Therefore, every memory cell is addressable with the row and column addresses. In this instance, each of the memory cells M11 to Mmn is implemented by a series combination of a switching transistor and a storage capacitor.

The addressing system is broken down into a row addressing sub-system and a column addressing sub-system, and the row addressing sub-system and the column addressing sub-system selects one of the word lines WL1 to WLm and one of the bit lines BL1 to BLn, respectively. The row addressing sub-system comprises a row address decoder unit 12 coupled through a row address buffer circuit (not shown) with an address port ADD, a word line driver unit 13 for selectively driving the word lines WL1 to WLm and the word lines WL1 to WLm. The word line driving unit 13 has a plurality of word line driver circuits 131 to 13m respectively associated with the word lines WL1 to WLm, and each of the word line driver circuits 131 to 13m is fabricated from an inverter 13n and a series combination of a p-channel enhancement type switching transistor 13p and an n-channel enhancement type switching transistor 13q coupled between a positive voltage line 13r and a ground voltage line GND. The positive voltage line 13r serves as an interconnection. The n-channel enhancement type switching transistor 13q is directly gated by the row address decoder unit 12 with the row address decoded signal, and the p-channel enhancement type switching transistor 13p is gated by the inverter 13n with the complementary signal of the row address decoded signal. Each of the word lines WL1 to WLm is coupled with the common drain node of the series combination incorporated in the associated word line driver circuit, and either positive voltage or ground voltage line 13r or GND is conducted through either switching transistor 13p or 13q with the associated word line depending upon a selected row address.

Row address bits indicative of one of the row addresses are supplied to the address port ADD, and the row address decoder unit 13 decodes the row address bits into the row address decoded signal. One of the word line driver circuits 131 to 13m is responsive to the row address decoded signal, and conducts the positive voltage line 13r through the p-channel enhancement type switching transistor 13p thereof with the word line assigned the selected row address. However, the other word lines are grounded through the n-channel enhancement type switching transistors 13q of the other word line driver circuits.

The column addressing sub-system is less important to the present invention, and no further description is incorporated hereinbelow.

The data transferring system comprises the bit lines BL1 to BLn and a data buffer unit 14 coupled with a data port TMO. Although other circuits such as a precharging circuit and a sense amplifier circuit are further incorporated in the data transferring system, these circuits are not shown in FIG. 2, because they are well know to a person skilled in the art.

Every adjacent two bit lines are paired with each other so that the bit lines BL1 to BLn are arranged for a plurality of bit line pairs. One of the bit line pairs is coupled through the column addressing sub-system with the data buffer unit 14, and the data buffer unit 14 produces an output data signal from a differential voltage on the selected bit line pair and a differential voltage from an input data signal at the data port TMO.

The controlling system supervises a read-out sequence, a write-in sequence and a refreshing sequence for the semiconductor memory device, and various external controlling signals such as, for example, a row address strobe signal, a chip enable signal and a write enable signal are supplied from the outside of the semiconductor memory device. However, only a power distributing circuit 15 is illustrated in FIG. 2, because the other circuits are less important for understanding the present invention.

The power distributing circuit 15 is coupled with one of the external control pin RAS, and comprises a delay element 15a and an inverter 15b. The inverter 15b is coupled between a power distributing line PW and the ground voltage line GND, and the power voltage Vcc and the test voltage level Vtst are selectively distributed through the power distributing line PW to the inverter 15b depending upon mode of operation. The delay element 15a introduces predetermined time delay into propagation of the row address strobe signal RAS to the inverter 15b, and controls a timing for driving the word lines WL1 to WLm. The inverter 15b is responsive to the delayed row address strobe signal RAS, and selectively supplies the power voltage Vcc or the ground voltage to the positive voltage line 13r. The power voltage level Vcc is usually 5 volts for the read-out sequence, the write-in sequence and the refreshing sequence. However, while the semiconductor memory device is subjected to an accelerating test operation, a test voltage Vtst over 7 volts is distributed to the inverter 15b.

The diagnostic system supervises various test operations carried out by the manufacturer before delivery to a purchaser, and the accelerating test operation actualizes potential defects of memory cells for previously screening out defective products. In order to support the test operations, the diagnostic system contains various circuits such as a signal generator for test enable signals and a comparator for a parallel bit test operation. However, FIG. 2 shows only circuits concerning confirmation of the accelerating test operation for the sake of simplicity.

A confirmation unit is incorporated in the diagnostic system, and comprises a first monitoring circuit 16 for the positive voltage line 13r, a second monitoring circuit 17 for the test voltage Vtst and a memory circuit 18 for storing a confirmation of an accelerating test duly carried out. The first monitoring circuit 16 comprises a delay element 16a coupled with the control signal pin RAS, a NOR gate 16b coupled with the delay element 16a and the positive voltage line 13r, a NAND gate 16c coupled with the control signal pin RAS and the NOR gate 16b and an inverter 16d. The first monitoring circuit 16 thus arranged monitors the positive voltage line 13r to see whether or not the test voltage level Vtst is duly applied to the positive voltage line 13r in the accelerating test operation. Namely, while the inverter 15b supplies the test voltage level Vtst to the positive voltage line 13r in response to the delayed row address strobe signal from the delay element 15a, the NOR gate 16b ignores the delayed row address strobe signal from the delay element 16a, and keeps the output signal inactive low. For this reason, the NAND gate 16c never shifts the output signal thereof to logic "0" level, and the inverter keeps the output node in inactive logic "0" level. However, if the inverter 15b does not supply the test voltage level Vtst in the present of the row address strobe signal RAS of the active low level, both input nodes of the NOR gate 16b are logic "0" level, and the NOR gate 16b yields the output signal of logic "1" level. After the row address strobe signal RAS is recovered to the high voltage level, the delay element 16a allows the NOR gate 16b to keeps the output signal in logic "1" for a short while, and the row address strobe signal recovered to logic "1" causes the NAND gate 16c to produce the output signal of logic "0" level. As a result, the inverter 16d supplies a warning signal WRN of logic "1" level to the memory circuit 18.

The second monitoring circuit comprises a series combination of p-channel enhancement type load transistors 17a, 17b and 17c coupled between the power distributing line PW and an output node 17d, a resistor 17e coupled between the output node 17d and the ground voltage line GND, and inverters coupled in series with the output node 17d. While the power distributing line PW is in the power voltage level Vcc, the output node 17d is lower than the threshold level of the inverter 17f, and the inverter 17f produces the output signal of the high voltage level. As a result, the inverter 17g keeps the output node thereof in the low voltage level. However, if the power distributing line PW goes up to the test voltage level Vtst, the output node 17d exceeds the threshold level of the inverter 17f, and the inverter 17f changes the output signal to the low voltage level. Therefore, the inverter 17g yields a detecting signal DTC of the high voltage level, and the detecting signal DTC is supplied to the memory circuit 18.

The memory circuit 18 is constituted by a nonvolatile memory section 18a, a write-in section 18b, a transfer section 18c and a control section 18d. The nonvolatile memory section 18a is implemented by a series combination of an n-channel enhancement type load transistor 18e, an n-channel enhancement type switching transistor 18f and a fuse element 18g coupled between a power voltage line and the ground voltage line GND. If the accelerating test is carried out without the test voltage level Vtst, the control section 18c allows the n-channel enhancement type switching transistor 18f to turn on, and the write-in section 18b supplies the power voltage level Vcc to the fuse element 18g so as to break the fuse element 18g.

The write-in section 18b is implemented by a p-channel enhancement type switching transistor 18h, and the p-channel enhancement type switching transistor 18h is much smaller in channel resistance than the n-channel enhancement type load transistor 18e. For this reason, even if current is supplied through the n-channel enhancement type load transistor 18e, the fuse element 18g is not broken. However, the p-channel enhancement type switching transistor 18h supplies current more than the n-channel enhancement type load transistor 18e, and, for this reason, the fuse element 18g is broken.

The transfer section 18c comprises an inverter 18i coupled with one of the control signal pins assigned to a test signal TM and a transfer gate 18j or a parallel combination of a p-channel enhancement type switching transistor and an n-channel enhancement type switching transistor coupled between the data port TMO and the drain node of the n-channel enhancement type load transistor 18e. In the accelerating test, the test signal TM is kept in the high voltage level, and a diagnostic system can inquire whether or not the accelerating test was duly carried out. Namely, the test signal TM and the complementary test signal cause the transfer gate 18j to turn on, and the control section 18d causes the n-channel enhancement type switching transistor 18f to turn on. If the fuse element 18g couples the source node of the n-channel enhancement type switching transistor 18f with the ground voltage line, any warning signal was not stored in the memory section 18a, and a relatively low voltage level is transferred from the drain node of the n-channel enhancement type load transistor 18e through the transfer gate 18j to the pin TMO. However, if the fuse element 18g was broken, the broken fuse element 18g teaches that the distributing circuit 15 did not supply the test voltage level Vtst to the word line driving unit 13 in the accelerating test, and a relatively high voltage level is transferred from the drain node through the transfer gate 18j to the pin TMO.

The control section 18d comprises two NAND gates 18k and 18m and an inverter 18n. The inverters 16d and 18g are coupled with the NAND gate 18k, and the NAND gate 18k produces a write control signal WR in the concurrent presence of the warning signal WRN of the active high voltage level and the detecting signal DTC of the active high voltage level, and the write control signal WR allows the p-channel enhancement type switching transistor 18h to turn on for supplying a large amount of current to the memory section 18a. The control signal pin for the test signal TM and the inverter 17g are coupled with the two input nodes of the NAND gate 18m, and the output node of the NAND gate 18m is coupled with the inverter 18n. While the diagnostic system requests the accelerating test to the semiconductor memory device, the test voltage level Vtst causes the second monitor circuit 17 to produce the detecting signal DTC, and the test signal TM of the active high voltage level is applied to the control signal pin. With the detecting signal DTC of the high voltage level and the test signal TM of the high voltage level, the NAND gate 18m yields the output signal of logic "0" level, and the inverter 18n causes the n-channel enhancement type switching transistor 18f to turn on.

The semiconductor memory device thus arranged selectively enters a standard mode and the diagnostic mode of operation. While the semiconductor memory device is staying in the standard mode, the power voltage Vcc of 5 volts is supplied to the semiconductor memory device, and the controlling system causes the addressing system and data transferring system to selectively carry out a read-out sequence, a write-in sequence and a refreshing sequence. These sequences in the standard mode are well know to a person skilled in the art, and no further description is hereinbelow incorporated.

Figure 3A:
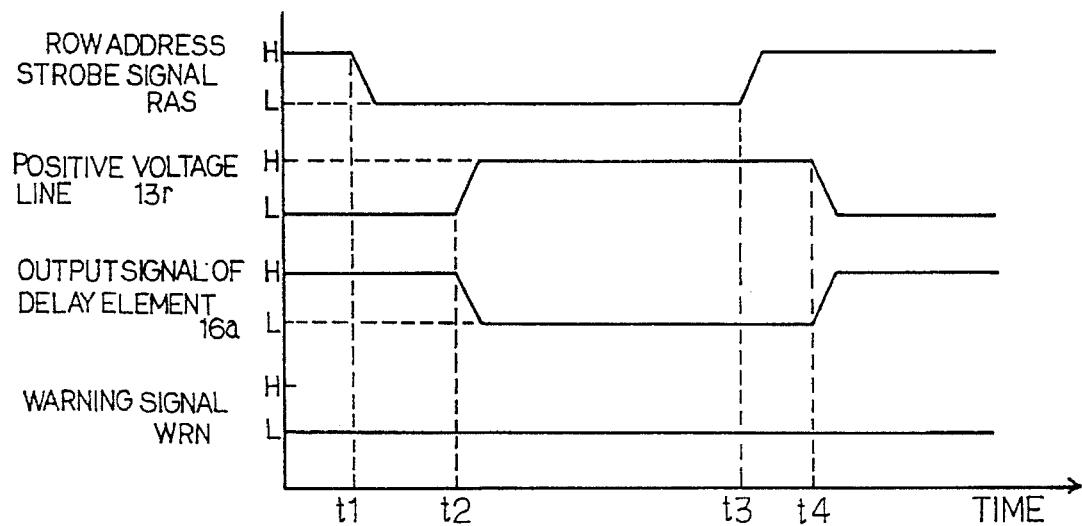
FIG. 3A and 3B are timing charts showing an excellent accelerating test operation and a failure in the accelerating test operation.

Upon completion of a fabrication process, the manufacture couples the semiconductor memory device with the diagnostic system, and the semiconductor memory device is subjected to various test operations. If the diagnostic system requests the accelerating test with the test signal TM of the high voltage level as well as the test voltage level Vtst, the diagnostic system sequentially changes the row address bits in synchronism with the row address strobe signal RAS, and the word lines WL1 to WLm are repeatedly driven to the test voltage level Vtst. In the accelerating test, the row address strobe signal RAS is decayed at time t1 as shown in FIG. 3A. The delay element 15a introduces predetermined time delay, and the row address decoder unit 12 decodes the row address bits. The row address decoder unit 12 produces the row address decoded signal, and the inverter 15b concurrently lifts the positive voltage line 13r to the test voltage level over 7 volts at time t2. The delay element 16a also retards the row address strobe signal RAS, and the delayed row address strobe signal RAS at the output node of the delay element 16a goes down at time t2. As a result, the logic "1" level and logic "0" level are supplied from the positive voltage line 13r and the delay element 16a to the NOR gate 16b, and the NOR gate 16b keeps the output signal in logic "0" level. The row address strobe signal RAS has already decayed to the low voltage level or logic "0" level, and the NAND gate 16c keeps the output signal in logic "1" level. As a result, the warning signal WRN never goes up to the active high voltage level.

The row address strobe signal RAS is recovered to the inactive high voltage level at time t3, and one of the input nodes of the NAND gate 16c is changed from logic "0" level to logic "1" level. However, logic "0" level from the NOR gate 16c keeps the output node of the NAND gate 16c in logic "1" level, and the warning signal WRN is kept in the inactive low voltage level. Since the delay elements 15a and 16a also retard the recovery of the row address strobe signal RAS to the inactive high voltage level, the positive voltage line 13r and the delayed row address strobe signal are recovered to the low voltage level and to the high voltage level at time t4. However, the NOR gate 16b keeps the output signal in logic "0" level, and the NAND gate 16c also keeps the output signal in logic "12 level. This means that the warning signal WRN is never lifted to the high voltage level in so far as the accelerating test is duly carried out with the test voltage level Vtst.

Figure 3B:
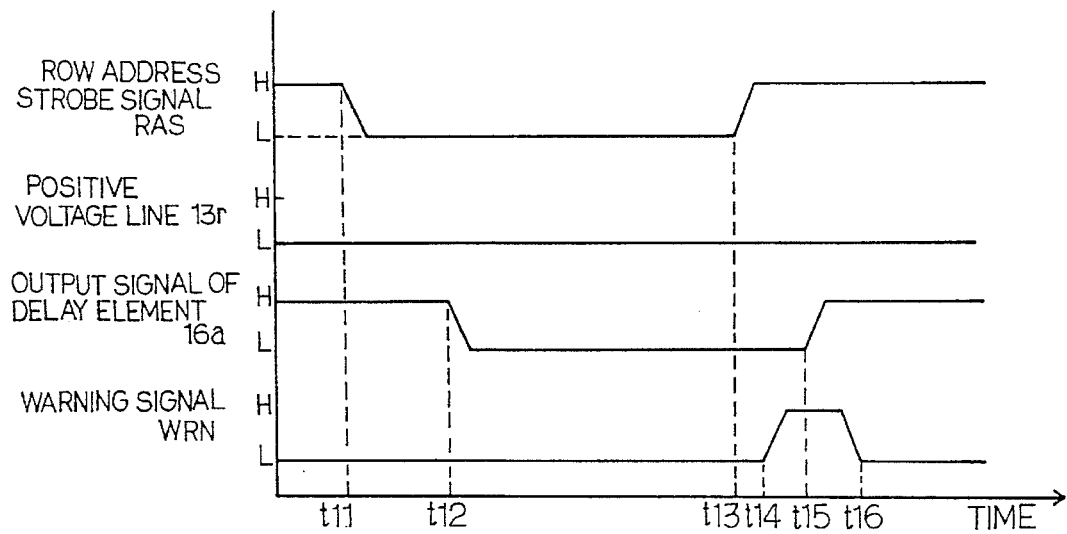

Assuming now that the distributing circuit 15 fails to lift the positive voltage line 13r to the test voltage level in the accelerating test, the row address strobe signal RAS decayed at time t11 of FIG. 3B did not have any influence on the positive voltage line 13r, and the positive voltage line 13r is kept in the low voltage level. However, the delay element 16a duly introduces time delay, and the delayed row address strobe signal is decayed at time t12. Then, logic "0" levels are simultaneously supplied to the two input nodes of the NOR gate 16b, and the NOR gate 16b produces the output signal of logic "1" level. However, the NAND gate 16c does not produce the output signal of logic "0" level, because the row address strobe signal RAS is kept in logic "0" level. Even though the row address decoder unit 12 causes the word line driver unit 13 to select one of the word line, the selected word line is never biased to the test voltage level Vtst, and actualization of potential defects is not accelerated.

If the row address strobe signal RAS is recovered to the inactive high voltage level at time t13, the NAND gate 16c shifts the output signal to logic "0" level, and the inverter 16d produces the warning signal WRN of logic "1" level at time t14. The second monitoring circuit 17 has produced the detecting signal of the high voltage level from the test voltage level Vtst, and the test signal TM of the high voltage level is applied to the NAND gate 18m. The NAND gate 18m produces the output signal of the low voltage level, and the inverter 18n supplies the high voltage level to the n-channel enhancement type switching transistor 18f so that the n-channel enhancement type switching transistor 18f turns on. The test signal TM further allows the transfer gate 18j to couple the pin TMO with the drain node of the n-channel enhancement type load transistor 18e. In this situation, the warning signal WRN of logic "1" level causes the NAND gate 18k to produce the low voltage level, and the p-channel enhancement type switching transistor 18h turns on. Then, a large amount of current flows through the p-channel enhancement type switching transistor 18k and the n-channel enhancement type switching transistor 18f to the fuse element 18g. This results in that the fuse element is broken, and the drain node of the n-channel enhancement type load transistor 18e is not conducted with the ground voltage line GND. This means that the drain node of the n-channel enhancement type load transistor 18e goes up to the relatively high voltage level, and the failure is reported from the pin TMO to the diagnostic system.

If the delay element 16a allows the delayed row address strobe signal RAS to be recovered to the high voltage level-at time t15, the warning signal WRN is decayed at time t16. Whenever the diagnostic system applies the test voltage Vtst and the test signal TM to the semiconductor memory device, the memory section teaches the failure of the accelerating test to the diagnostic system.

As will be appreciated from the foregoing description, the confirmation unit checks the positive voltage line 13r to see whether or not the accelerating test is duly carried out with the test voltage level Vtst, and reports the failure to the diagnostic system. Therefore, the manufacturer can eliminate doubt products, and the reliability is surely improved.

Although a particular embodiment of the present invention has been shown and described, it will be obvious to those skilled in the art that various changes and modifications may be made without departing from the spirit and scope of the present invention. For example, the present invention is applicable with any type of semiconductor memory device in so far as the semiconductor memory device is subjected to the accelerating test operation, and the semiconductor memory device may form a part of a large scale integration. Moreover, the write-in section 18b may be implemented by a combination of an inverter and an n-channel type switching transistor.

What is claimed is:

1. A semiconductor memory device fabricated on a semiconductor chip and selectively entering a standard mode and a diagnostic mode of operation, comprising:

a) a memory cell array having a plurality of addressable memory cells for storing data information;

b) a data transferring system selectively coupled with said plurality of addressable memory cells, and operative to relay data information between said memory cell array and a data port in said standard mode of operation;

c) power distributing means for receiving a predetermined voltage level and a test voltage level, and having a power distributing circuit responsive to an external control signal for selectively supplying said predetermined voltage level in said standard mode and said test voltage level in an accelerating test of said diagnostic mode to a power supply line at a predetermined timing;

d) an addressing system having a plurality of word lines selectively coupled with said plurality of addressable memory cells and a word line driving unit coupled with said power supply line for selectively driving said plurality of word lines to said predetermined voltage level in said standard mode and to said test voltage level, larger in magnitude than said predetermined voltage level, in said accelerating test operation, said plurality of memory cells being selectively driven by said plurality of word lines; and e) a diagnostic system having a first monitoring unit operative to monitor said power supply line to see whether or not said test voltage level is supplied to said addressing system in said accelerating test for producing a warning signal indicative of an accelerating test without said test voltage level, a second monitoring unit operative to monitor said power distributing means to see whether or not said test voltage level is supplied to said power distributing means in said accelerating test for producing a detecting signal indicative of said test voltage level, and a non-volatile memory means enabled with said detecting signal and operative to store said warning signal.

2. A semiconductor memory device as set forth in claim 1, in which said power distributing circuit comprises a first delay element for retarding said external control signal, and a first inverter coupled between said first delay element and said power supply line and powered by said power distributing means.

3. A semiconductor memory device as set forth in claim 2, in which said first monitoring unit comprises a second delay element for retarding said external control signal, a NOR gate coupled with said first inverter and with said second delay element, a first NAND gate having a first input node supplied with said external control signal and a second input node coupled with the output node of said NOR gate, and a second inverter coupled with the output node of said first NAND gate for producing said warning signal.

4. A semiconductor memory device as set forth in claim 1, in which said second monitoring unit comprises: a series combination of load elements coupled between said power distributing means and a constant voltage source a plurality of inverters connected in series and coupled, on one end, to said series combination of load elements at a node between two of said load elements, said plurality of inverters providing, at another end, said detecting signal.

5. A semiconductor memory device as set forth in claim 1, in which said non-volatile memory means comprises a memory section coupled between said power voltage line and a constant voltage line and having a breakable element, a control section discriminating said warning signal in the presence of said detecting signal for producing a write control signal, a write-in section responsive to said write control signal for breaking said breakable element, and a transfer section responsive to a test signal for coupling said memory section with one of external pins of said semiconductor memory device and operative to report whether or not said accelerating test is duly carried out with said test signal.

6. A semiconductor memory device as set forth in claim 5, in which said memory section is implemented by a series combination of a load transistor, a first switching transistor kept in on-state in the concurrent presence of presence of said detecting signal and said test signal and said breakable element.

7. A semiconductor memory device as set forth in claim 6, in which said control section comprises a first NAND gate supplied with said warning signal and said detecting signal for producing said write control signal, a second NAND gate supplied with said detecting signal and said test signal for producing a control signal, and an inverter coupled between said second NAND gate and a gate electrode of said first switching transistor for supplying a complementary control signal indicative of said concurrent presence of said detecting signal and said test signal.

8. A semiconductor memory device as set forth in claim 7, in which said write-in section is implemented by a second switching transistor coupled between said power voltage line and a drain node of said load transistor and smaller in channel resistance than said load transistor, said second switching transistor being responsive to said write control signal for providing a current path from said power voltage line to said drain node of said load transistor.

9. A semiconductor memory device as set forth in claim 8, in which said transfer section comprises a transfer gate coupled between said one of said external pins and said drain node of said load transistor, and an inverter supplied with said test signal for producing a complementary test signal, said test signal and said complementary test signal being supplied to said transfer gate.

* * * * *